(12) United States Patent
Pachler

(10) Patent No.: US 7,777,236 B2
(45) Date of Patent: Aug. 17, 2010

(54) LIGHT-EMITTING DIODE ARRANGEMENT COMPRISING A COLOR-CONVERTING MATERIAL

(75) Inventor: Peter Pachler, St. Peter (AT)

(73) Assignee: Tridonic Optoelectronics GmbH, Jennersdorf (AT)

( * ) Notice: Subject to any disclaimer, the term of this patent is extended or adjusted under 35 U.S.C. 154(b) by 270 days.

(21) Appl. No.: 11/718,596

(22) PCT Filed: Aug. 24, 2005

(86) PCT No.: PCT/EP2005/009141

§ 371 (c)(1),
(2), (4) Date: May 20, 2008

(87) PCT Pub. No.: WO2006/048064

PCT Pub. Date: May 11, 2006

(65) Prior Publication Data

US 2009/0194776 A1    Aug. 6, 2009

(30) Foreign Application Priority Data

Nov. 3, 2004  (DE) .................. 10 2004 053 116

(51) Int. Cl.
*H01L 29/267* (2006.01)
*H01L 29/16* (2006.01)

(52) U.S. Cl. .................. 257/81; 257/13; 257/82; 257/98; 257/E33.061; 257/E33.073

(58) Field of Classification Search .................. 257/13, 257/81, 82, 98, 918, E33.061, E33.073
See application file for complete search history.

(56) References Cited

U.S. PATENT DOCUMENTS

| 6,864,861 | B2 * | 3/2005 | Schehrer et al. ................. 345/7 |
| 7,556,404 | B2 * | 7/2009 | Nawashiro et al. .......... 362/293 |
| 2003/0002272 | A1 | 1/2003 | Suehiro et al. |
| 2003/0141563 | A1 | 7/2003 | Wang |
| 2006/0081862 | A1 * | 4/2006 | Chua et al. .................... 257/98 |
| 2009/0121615 | A1 * | 5/2009 | Le Toquin .................. 313/503 |

FOREIGN PATENT DOCUMENTS

| DE | 2260285 | 6/1973 |
| EP | 1411557 | 4/2004 |
| JP | 10107325 | 4/1998 |
| WO | 00/38250 | 6/2000 |
| WO | 01/82385 | 11/2001 |

* cited by examiner

*Primary Examiner*—Long K Tran
(74) *Attorney, Agent, or Firm*—Fish & Associates, PC

(57) ABSTRACT

With a light-emitting diode arrangement (1) having a light-emitting diode chip (2) arranged on a base (3), and colour conversion material (7) surrounding the light-emitting diode chip (2), which material is constituted to convert at least a part of the light emitted by the light-emitting diode chip (2) into light of another wavelength, the colour conversion material (7) is surrounded to the side by a reflector (8), the lateral distance (x) of the light-emitting diode chip (2) to the reflector (8) amounting to at most 0.5 mm.

15 Claims, 3 Drawing Sheets

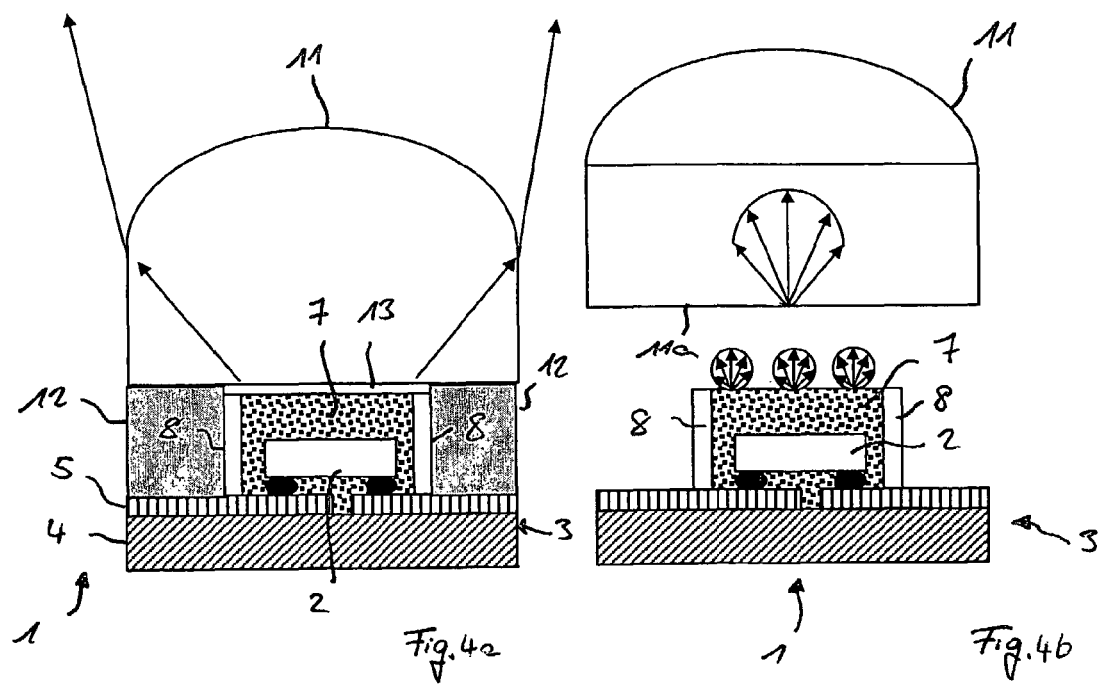
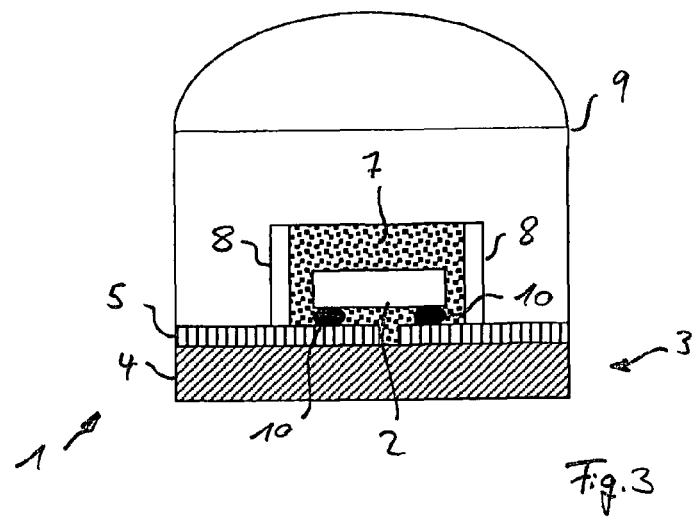

LIGHT-EMITTING DIODE ARRANGEMENT COMPRISING A COLOR-CONVERTING MATERIAL

FIELD OF THE INVENTION

The present invention relates to a light-emitting diode arrangement in accordance with the preamble of claim 1 which has a light-emitting diode chip which is surrounded by a colour conversion material which is used to convert at least a part of the light emitted by the light-emitting diode chip into light of another wavelength.

BACKGROUND OF THE INVENTION

The field of light-emitting diodes and in particular the field of the so-called "white LEDs" form the background to the present invention. Since light emitting semiconductor elements as a rule emit light at a specific wavelength, the production of a semiconductor element which directly provides white light has not yet been achieved. Instead, the semiconductor elements are configured such that they emit light of an individual wavelength, for example in the colours green, red or blue. To make the generation of white light possible nevertheless, it is known from the state of the art to convert the light of blue LEDs by means of colour conversion into a white light mixture. Thereby a phosphor, which is normally embedded in a matrix, is arranged around the semiconductor element—the so-called LED die. The blue light is now absorbed in the surroundings of the LED die by the phosphors and then converted into longer wavelength light. This longer wavelength light of the phosphors, in combination with the unconverted blue light of the light-emitting diode chip, then results in a white light mixture.

The forms for the arrangement of the colour conversion material around the LED die which are known from the state of the art usually have, however, the defect that that the light which emerges from the colour conversion material surrounding the LED chip is not homogeneously white but has different colour according to spatial direction and/or has different colouring at the surface of the phosphor layer. With collimation and imaging of the emitted light—for example with aid of a lens—this leads to reinforcement of the colour inhomogeneities.

The cause of these inhomogeneities lies in that the colour converted component increases proportionally to the path of the light through the phosphor/matrix surroundings. Due to the fact that the light-emitting diode chip, which is usually configured to be cubic or cuboid, imitates light in all directions it is very difficult to realize a uniform conversion of the light. A considerable disadvantage now, however, results from this for an imaging optical system which is to realize homogeneously white light from an inhomogeneous light emitting area. White LEDs therefore typically have, with conventional optical system, an inhomogeneous white emission the imaging of which is coloured bluish in the centre and yellowish at the margins.

Various arrangements are known from the state of the art with which it is attempted to convert the light emitted by a light-emitting diode chip as homogeneously as possible into a white light mixture. Two known configurations are illustrated in FIGS. 5 to 7 and are discussed briefly below.

The first known light-emitting diode arrangement 100 in FIGS. 5 and 6 has firstly a light-emitting diode chip 101 which is arranged on a base 102. The base 102 consists for example of a thermally conductive insulating layer 103, on the upper side of which there is located an electrically conductive layer with conductor paths 104, on which in turn the LED die 101 is arranged. The electrical contacting of the LED die is effected to the side from the conductor paths 104 by means of bonding wires 105 which lead to the upper side of the light-emitting diode chip 101.

To colour-convert the light emitted by the light-emitting diode chip 101, this is surrounded by a hemispherical shaped encapsulation which is filled completely with a colour conversion material 106. With this arrangement it is sought to attain a uniform surface colour through the approximately uniformly long path of the light rays through the hemispherical shaped encapsulation. The emergence of the light, with a refractive index transition of n≈1.4 to 1.6 for the encapsulation with respect to air with n=1, provides—corresponding to the illustration in FIG. 6a—local equalisation of the part emission of the non-converted blue light and of colour-converted light converted in colour by the phosphors of the colour conversion material 106. Through this the resulting light mixture is homogenized with regard to its colour.

The known construction requires, however, that the light-emitting diode chip 101 can essentially be considered to be a point and the encapsulation therefore must be substantially larger than the light emitting area at the light-emitting diode chip 101, though. In turn this brings with it the disadvantage that for imaging of such a system a very large lens is needed, since for effective light directing the luminescent surface should act approximately as a point also for the lens. The size of the mimumum usable hemisphere for colour conversion is correspondingly approximately three to four times the edge length of the light-emitting diode chip 101, whilst however the size of the lens should be approximately ten to twenty times the luminescent surface.

FIG. 6 shows a complete arrangement for a white light LED in which a spherical converter geometry and a lens 107 including the arrangement is put to use. Since for the imaging of the light only a restricted angular range of the emission can be put to use, in the case of a hemispherical converter heavy lateral light losses are to be expected, i.e. a certain proportion of the light cannot be imaged by the lens 107 due to the emission characteristics.

If, however, instead of a light conversion material configured in form of a hemisphere there is used a coating with a constant thickness, then there is provided the arrangement illustrated in FIG. 7.

Firstly, this second variant of a known light-emitting diode arrangement 120 consists again of a light-emitting diode chip 121 which is arranged on a base 122 consisting of an insulation layer 123 and a layer with conductor paths 124. As in the case of the first known arrangement, contacting is here effected also by means of a bonding wire 125 which is led to the upper side of the light-emitting diode chip 121.

The colour conversion material 126 is now arranged such that it covers the surface of the light-emitting diode chip 121 all over and uniformly with a constant thickness. The light rays exiting the colour conversion material 126 are then again collimated by a lens 127.

If the coating is chosen to be too thin, then the electrode structure of the LED chip 121 is still visible, what with imaging at a small emission angle (e.g. less than 10°) leads to an uneven imaging in the incident light field. The electrode structure also can lead to colour unevennesses if the layer of colour conversion material 126 is very thin. This is for example the case then if larger areas of the chip 121 do not luminesce.

If the layer has, in contrast, a greater layer thickness, there is the risk that the edge of the layer emits in another colour. However, at least then the electrode structure would no longer be visible and colour inhomogeneities due to larger, non-luminescent electrode structures could also be avoided.

With this known arrangement the light rays emitted by the side areas can therefore be only partly used for imaging. With increasing layer thickness more and more light is emitted through the side areas, through which the quota of utilizable light is further reduced. This known configuration therefore also has disadvantages with regard to the achievable homogeneous white light emission and the possibility of imaging this by means of an optical system.

There are many intermediate geometries between the known configurations illustrated in FIGS. 5 to 7 for light-emitting diode arrangements, which however are not realized since in substance only the structural height for the light-emitting diode arrangement illustrated in FIG. 6 has an acceptable size.

A possibility for generating white light without use of a colour conversion material is described in WO 02/50472 A1. This publication describes a light-emitting diode arrangement with which several light-emitting diode chips of different colours are arranged on the base side of a funnel-shaped reflector. Through the arrangement of the differently coloured light-emitting diode chips, as well as a special configuration of the reflector, it is achieved that the light of the light-emitting diode chips mixes in total to white light. However, this known construction is very complex in comparison with the solutions illustrated in FIGS. 5 to 7, in which respectively individual light-emitting diode chips can be used.

SUMMARY OF THE INVENTION

The present invention is based correspondingly on the object of indicating a possibility for the realization of a light-emitting diode arrangement with which the light emitted by a light-emitting diode chip is converted by means of a colour conversion material for the production of light mixture and in which the disadvantages described in connection with the state of the art are avoided. In particular there is to be provided a surface emitting white light which can be imaged homogeneously and without colour deviations, by means of a conventional optical system.

The object is achieved by means of a light-emitting diode arrangement which has the features of the claim 1. Advantageous further developments of the invention are subject of the dependent claims.

There is thus proposed a light-emitting diode arrangement which has a light-emitting diode chip arranged on a base and a colour conversion material surrounding the light-emitting diode chip which is configured to convert at least a part of the light emitted by the light-emitting diode chip into light of another wavelength. In accordance with the invention the colour conversion material is surrounded to the side by a reflector, whereby the distance from the light-emitting diode chip to the reflector amounts to at most 0.5 mm. Preferably the distance between the light-emitting diode chip and the reflector is solely in the range between 0.1 mm and 0.2 mm.

Thus, in accordance with the present invention, for avoidance of the known colour inhomogeneities, the colour conversion material is bounded to the side by a—preferably vertically arranged—reflector. Although it is already known to surround LED chips by a reflector or reflective elements, in the known cases the distance between the light-emitting diode chip and the reflector is however considerably greater than is provided in accordance with the present invention. The cause for it lies in that, in the state of the art, the reflective elements are exclusively provided to collimate the light emitted by the light-emitting diode chip already in a certain direction. The primary object of the reflector in accordance with the present invention, however, consists in optimizing the path of the light through the colour conversion material for attaining a homogeneous emission of mixed light.

Thus, firstly a lateral emission of light is excluded by the reflector, which could only partly be used, that is imaged, by a refracting lens. On the other hand the use of the reflector permits a larger layer thickness for the colour conversion material above the light-emitting diode chip. In turn this larger layer thickness leads to a better colour mixing of the light so that possible electrode structures of the light-emitting diode chip no longer appear through the colour conversion material. Another advantage also consists in that with aid of the reflector the size of the area to be imaged is kept as small as possible, through which the structural size of a possibly used optical system, in particular a lens, is also kept within limits.

The thickness of the colour conversion material covering over the upper side of the light-emitting diode chip is preferably at least 0.05 mm, whereby it is in particular provided that the thickness is at least 0.05 mm larger than the distance between the light-emitting diode chip and the reflector.

As you already mentioned, an optical system is preferably provided for collimating the light emitted by the light-emitting diode chip. This optical system may be, on the one hand, a lens which surrounds the light-emitting diode chip and the colour conversion material. On the other hand it can however be provided also that a lens is used which—seen in the direction of emission—is arranged in front of the light-emitting diode chip. In accordance with a particularly preferred exemplary embodiment it can be provided that the lens is arranged separated from the surface of the colour conversion material, in particular separated by an air-gap. As will be explained in more detail below, through this special configuration a particularly good mixing, and with that in a colour-homogeneous light emission, is attained.

The reflector surrounding the colour conversion material over its complete height preferably may on the one hand be of metal; it would however also be conceivable to form the reflector diffusely reflecting, for which Teflon or another suitable material could for example be used.

BRIEF DESCRIPTION OF THE DRAWING

The invention will be explained below in more detail with reference to the accompanying drawings. There is shown:

FIG. 3 a second exemplary embodiment of a light-emitting diode arrangement in accordance with the invention;

FIGS. 4a and 4b a third exemplary embodiment of a light-emitting diode arrangement in accordance with the invention, and FIGS. 5-7 light-emitting diode arrangements in accordance with the state of the art.

DETAILED DESCRIPTION

Figure 1:
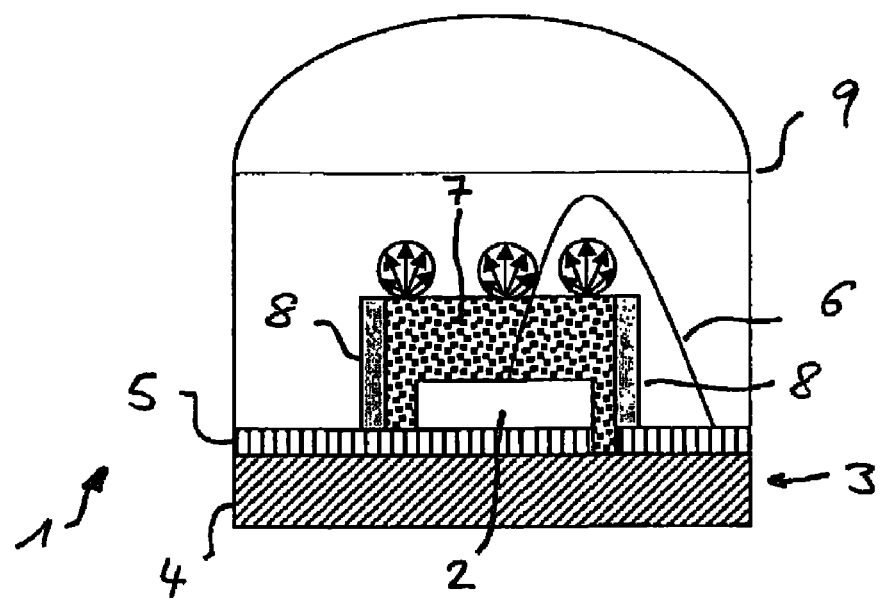
FIG. 1 a first exemplary embodiment of a light-emitting diode arrangement in accordance with the invention.

Firstly the light-emitting diode arrangement illustrated in FIG. 1 and provided with the reference sign 1 has a light-emitting diode chip 2—preferably emitting blue light—which is arranged on a base 3, which has an insulation layer 4 as well as an electrically conductive layer with conductor paths 5, whereby for contacting of the light-emitting diode chip 3 bonding wires lead from these conductors paths to the upper side of the chip. It is to be noted that the base 3 could also be configured in other manner. In particularly specific measures could be taken which make possible an effective heat dissipation from the light-emitting diode chip 2.

To convert the light emitted by the light-emitting diode chip 2 into a white light mixture, a colour conversion material 7 is provided which surrounds the light-emitting diode chip 2 and has colour conversion particles, in particular phosphors, which convert at least a part of the light into a light of another wavelength. In accordance with the invention the light-emitting diode chip 2 and the colour conversion material 7 are surrounded by a reflective wall 8 which for example can be formed by a metallic reflector or else configured to be diffusely reflective and for this purpose is for example of Teflon or e.g. barium sulphate. Unlike known light-emitting diode arrangements the reflective wall 8 is already applied around the light-emitting diode chip 2 at a distance of less than 0.5 mm; it is optimally ca. 0.1 mm to 0.2 mm from the side faces of the light-emitting diode chip 2.

By means of the—preferably vertically oriented—reflective wall 8 light radiated to the side by the light-emitting diode chip 2 is again deflected and therewith the size of the light emitting area is firstly restricted to that of the upper opening of the reflector 8. Further, light which exits to the side from the light-emitting diode chip 2 is partly converted in the surrounding colour conversion material 7, or that component which was not absorbed and converted upon first passage through the phosphor particles, is reflected at the reflection wall 8 and then directed back, until this light also has a white spectral distribution and exits at the upper side of the colour conversion material 7.

The arrangement consisting of the LED chip 2, the colour conversion material 7 and the reflector 8 is finally surrounded by an optical system which is formed by a lens 9 which encloses the arrangement. The lens 9 is configured such that it has a curved surface only in its upper area, to image the light exiting at the upper side of the colour conversion material 7 in a desired manner. The lower cylindrically shaped area of the lens, however, does not have any optical function since due to the delimitation of the light emitting area with aid of the reflector 8 no light exits in these areas in any event. The reflector 8 therefore allows a lens configured very simply and compactly to be used, which nonetheless completely images the light emitted by the light-emitting diode chip and, if applicable, converted by the colour conversion material 7. Light exiting at the side, however, which has an undesired colour mixture and consequently could not be of use, is not present with the light-emitting diode arrangement in accordance with the invention.

Figure 2:
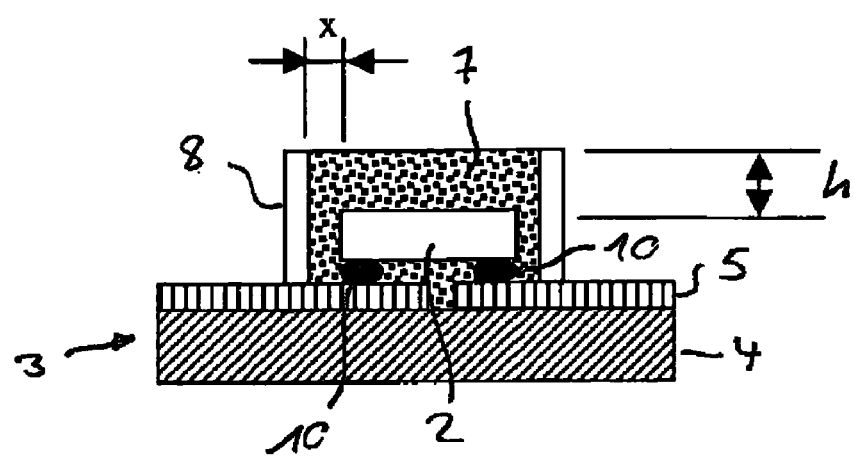
FIG. 2 a schematic for explanation of the geometric dimensions of the colour conversion material used for the colour conversion.
Figure 5:
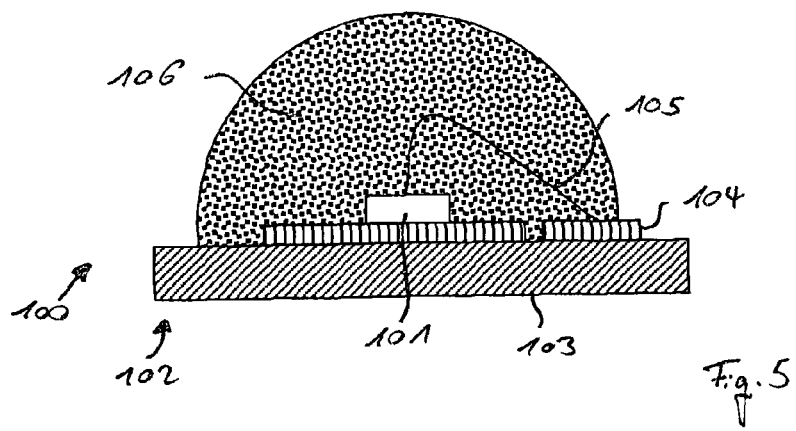
Figure 6:
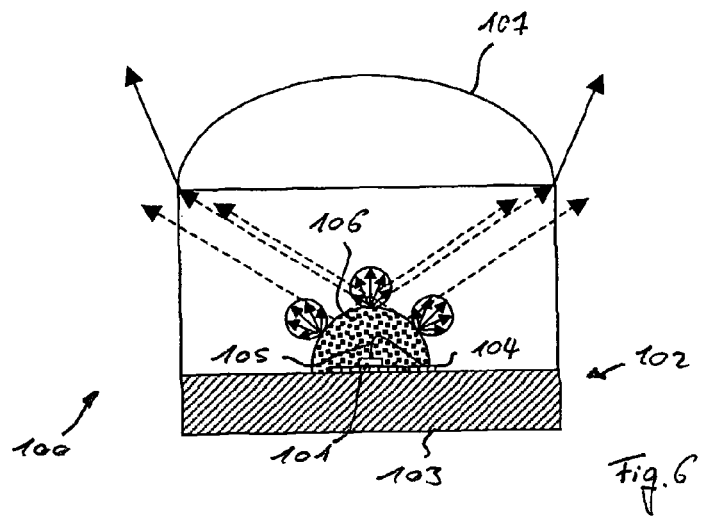
Figure 7:
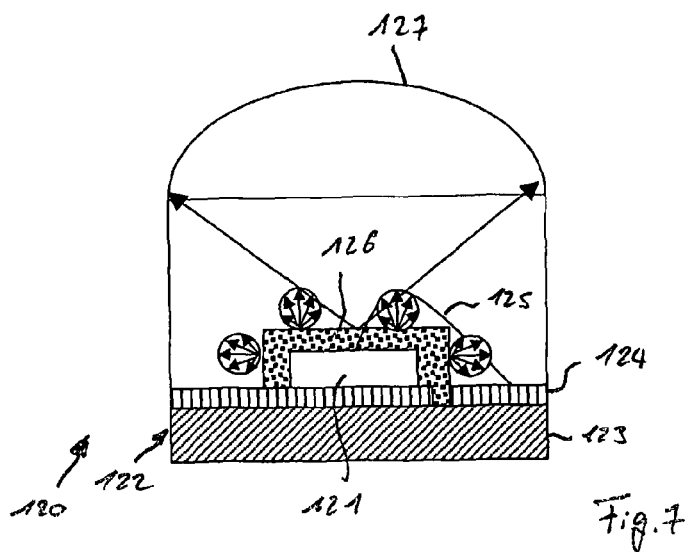

The particular dimensions of the light-emitting diode arrangement 1 in accordance with the invention are again made clear in FIG. 2, which shows a part of a second exemplary embodiment of the light-emitting diode arrangement in accordance with the invention. As can be discerned from this illustration, the distance between the side face of the light-emitting diode chip 2 and the reflector 8 is designated by x, whilst in contrast the distance of the upper surface of the light-emitting diode chip 2 to the upper surface of the colour conversion material 7 is designated by h. As already mentioned distance x between the light-emitting diode chip and the reflector 8 is chosen in accordance with the invention to be small and amounts to at most to 0.5 mm, preferably between 0.1 mm to 0.2 mm. However, the height h of the colour conversion layer 7 amounts to at least 0.05 mm and is chosen preferably such that for the minimum height there applies $h_{min}=0.05$ mm+x. An upper limit for the height h of the colour conversion layer in principle does not arise since the production of the light mixture is optimized, the larger the height is. As mentioned already at the beginning, the probability of conversion of the light emitted by the light-emitting diode chip 2 is proportional to the path length of the light through the colour conversion material 7, for which reason for attaining a homogeneous light emission a thickness as large as possible should be striven for. For production technical reasons, however, preferably an upper limit is chosen for the thickness h of 3 mm, since overall a configuration of the light-emitting diode arrangement as compact and flat as possible is also striven for.

A difference compared with the first exemplary embodiment of the light-emitting diode arrangement illustrated in FIG. 1, in the arrangement in FIG. 2, consists in that now the electrical contacting of the light-emitting diode chip 2 is no longer effected by bonding wires. Instead, the chip 2 is "face down" in the illustrated configuration; that is, arranged reversed. The contacting is effected in such a case by means of so-called bumps 10 which directly produce a contacting of the layer with the conductor paths 5 to the surface of the chip 2. This arrangement, often described as flip-chip technology, of the light-emitting diode chip 2 on the base 3 also brings about among others advantages with regard to the achievable light intensity, since with this assembly technique improved light yield can be obtained. Among other things this can be explained in that no bonding wires are required and therewith a shadow free emission surface is obtained. A complete arrangement of a light-emitting diode arrangement, in which the reflector 8 is then surrounded by the colour conversion material 7, and the light-emitting diode chip 2 in turn by a lens arrangement 9, is illustrated in FIG. 3.

In the two exemplary embodiments in accordance with the invention discussed above the colour conversion material 7 and the reflector 8 are directly enclosed by the optical system forming the lens 9. FIGS. 4a and 4b now show a third exemplary embodiment of a light-emitting diode arrangement 1 in accordance with the invention, in which a so-called ancillary lens 11 is used, which is arranged at distance from the surface of the colour conversion material 7. Firstly, the light-emitting diode arrangement 1 has again the same elements as the exemplary embodiment of FIG. 3, the same components being provided with the same reference signs. Now, in addition however, there are arranged on the surface of the electrically conductive layer with the conductor paths 5 spacers 12, on the upper side of which the ancillary lens 11 is arranged. The height of the spacers 12, which can for example be formed by another insulation layer, is chosen such that the ancillary lens 11 is separated by a small air-gap 13 from the colour conversion material 7. Through this a particularly efficient imaging of the light from the upper side of the colour conversion material 7 is made possible.

Namely the light that exits through the upper surface of the colour conversion material 7 is now coupled via the air-gap 13 into the ancillary lens 11. Upon exit from the colour conversion agent 7 the light is, due to the control by the phosphor material and the refractive index transition from the phosphor matrix material to air, distributed according to Lamber, i.e. light emission is substantially equally large in all directions. In turn this distribution upon entry into the ancillary lens 11 is collimated to a range of for example ±41.8°, corresponding to the refractive index of the lens, in case that the refractive index of the ancillary lens 11 is n=1.5. This effect is illustrated in FIG. 4b. Upon exit from the lens 11 the light rays then must at most be deflected, e.g. for a 40° lens, by 21.8°, which can be realized without greater outlay and in particular carried out without greater losses.

The illustrated construction with the colour conversion material bounded at the side by a reflector thus offers the possibility of imaging light—with the exception of Fresnel reflections—to almost 100%. With this, in comparison with the state of the art the useful light component can be increased substantially within a desired target area. At the same time a more effective colour mixing is attained, by means of which it is ensured that, also by means of a lens or other conventional optical system, a white mixed light can be imaged homogeneously in an effective way.

The invention claimed is:

1. Light-emitting diode arrangement, having:
   a light-emitting diode chip arranged on a base, and colour conversion material covering on top and surrounding to the side and covering over the light-emitting diode chip, which material is constituted to convert at least a part of the light emitted by the light-emitting diode chip into light of another wavelength,
   characterized in that, the colour conversion material surrounding to the side the light-emitting diode chip is surrounded to the side by a reflector, the lateral distance of the light-emitting diode chip to the reflector being between 0.1 and 0.5 mm.

2. Light-emitting diode arrangement according to claim 1, characterized in that, the distance (x) from the light-emitting diode chip (2) to the reflector (8) is in the range between 0.1 mm and 0.2 mm.

3. Light-emitting diode arrangement according to claim 1 or 2, characterized in that, the reflector (8) surrounds the colour conversion material (7) over the complete height thereof.

4. Light-emitting diode arrangement according to claim 1, characterized in that, the reflector (8) is vertically directed.

5. Light-emitting diode arrangement according to claim 1, characterized in that, the thickness (h) of the colour conversion material (7) covering the upper side of the light-emitting diode chip (2) is at least 0.05 mm.

6. Light-emitting diode arrangement according to claim 5, characterized in that, the thickness (h) of the colour conversion material (7) covering the upper side of the light-emitting diode chip (2) is at least 0.05 mm larger than the distance (x) between the light-emitting diode chip (2) and the reflector (8).

7. Light-emitting diode arrangement according to claim 5 or 6, characterized in that, the thickness (h) of the colour conversion material (7) covering the upper side of the light-emitting diode chip (2) is at most 3 mm.

8. Light-emitting diode arrangement according to claim 1, characterized by an optical system for collimating the light emitted by the light-emitting diode chip (2).

9. Light-emitting diode arrangement according to claim 8, characterized in that, the optical system is formed by a lens (9) which surrounds the light-emitting diode chip (2) and the colour conversion material (7).

10. Light-emitting diode arrangement according to claim 8, characterized in that, the optical system is formed by a lens (11), which-seen in direction of emission-is arranged in front of the light-emitting diode chip (2).

11. Light-emitting diode arrangement according to claim 10, characterized in that, the lens (11) is arranged separated from the surface of the colour conversion material (7).

12. Light-emitting diode arrangement according to claim 11, characterized in that, the lens (11) is separated from the surface of the colour conversion material (7) by an air-gap.

13. Light-emitting diode arrangement according to claim 1, characterized in that, the reflector (8) is of metal.

14. Light-emitting diode arrangement according to claim 1, characterized in that, the reflector (8) is diffusely reflectively.

15. Light-emitting diode arrangement according to claim 14, characterized in that, the reflector is of Teflon.

* * * * *